United States Patent
Ho et al.

(10) Patent No.: US 8,164,172 B2
(45) Date of Patent: Apr. 24, 2012

(54) INTEGRATED CIRCUIT PACKAGE IN PACKAGE SYSTEM

(75) Inventors: Tsz Yin Ho, Tuen Mun (HK); Dioscoro A. Merilo, Singapore (SG); Seng Guan Chow, Singapore (SG); Antonio B. Dimaanor, Jr., Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/166,417

(22) Filed: Jun. 22, 2011

(65) Prior Publication Data

US 2011/0248411 A1 Oct. 13, 2011

Related U.S. Application Data

(62) Division of application No. 11/276,647, filed on Mar. 8, 2006, now Pat. No. 7,981,702.

(51) Int. Cl.
*H01L 23/02* (2006.01)

(52) U.S. Cl. .......................................... 257/686; 257/777

(58) Field of Classification Search .................... None
See application file for complete search history.

(56) References Cited

U.S. PATENT DOCUMENTS

| | | | |
|---|---|---|---|
| 4,363,076 A * | 12/1982 | McIver | 361/718 |
| 5,147,815 A | 9/1992 | Casto | |
| 5,157,480 A | 10/1992 | McShane et al. | |
| 5,222,014 A | 6/1993 | Lin | |
| 5,394,303 A * | 2/1995 | Yamaji | 361/749 |
| 5,625,228 A | 4/1997 | Rogren | |
| 5,685,477 A | 11/1997 | Mallik et al. | |
| 5,773,313 A * | 6/1998 | Sato et al. | 438/123 |
| 5,801,439 A * | 9/1998 | Fujisawa et al. | 257/686 |
| 5,835,988 A * | 11/1998 | Ishii | 257/684 |
| 5,877,042 A * | 3/1999 | Mattson et al. | 438/123 |
| 6,084,293 A * | 7/2000 | Ohuchi | 257/686 |
| 6,168,975 B1 | 1/2001 | Zhang et al. | |
| 6,190,944 B1 | 2/2001 | Choi | |
| 6,229,200 B1 | 5/2001 | Mclellan et al. | |
| 6,420,779 B1 | 7/2002 | Sharma et al. | |
| 6,420,799 B1 | 7/2002 | Sakamoto et al. | |
| 6,424,031 B1 * | 7/2002 | Glenn | 257/686 |
| 6,433,418 B1 * | 8/2002 | Fujisawa et al. | 257/696 |
| 6,445,064 B1 * | 9/2002 | Ishii et al. | 257/686 |
| 6,500,698 B2 * | 12/2002 | Shin | 438/112 |
| 6,559,525 B2 * | 5/2003 | Huang | 257/675 |
| 6,607,937 B1 | 8/2003 | Corisis | |
| 6,624,005 B1 * | 9/2003 | DiCaprio et al. | 438/113 |
| 6,730,544 B1 * | 5/2004 | Yang | 438/110 |
| 6,815,806 B1 | 11/2004 | Awad et al. | |
| 6,838,751 B2 | 1/2005 | Cheng et al. | |

(Continued)

*Primary Examiner* — David E Graybill

(74) *Attorney, Agent, or Firm* — Ishimaru & Associates LLP; Mikio Ishimaru; Stanley Chang

(57) ABSTRACT

An integrated circuit package in package system includes: a base integrated circuit package with a base lead substantially coplanar with a base die paddle and having a portion with a substantially planar base surface; an extended-lead integrated circuit package with an extended lead having a portion with a substantially planar lead-end surface; a package-stacking layer over the base integrated circuit package; and the extended-lead integrated circuit package over the base integrated circuit package including: an end portion of the extended lead, directly on the package-stacking layer, and the extended lead exposed by and extending away from the bottom of the side of an extended-lead encapsulation and bending downwards toward the direction of the package stacking layer with the substantially planar lead-end surface coplanar with the substantially planar base surface.

10 Claims, 6 Drawing Sheets

U.S. PATENT DOCUMENTS

| | | | |
|---|---|---|---|
| 6,861,288 B2 | 3/2005 | Shim et al. | |
| 6,906,416 B2 | 6/2005 | Karnezos | |
| 6,917,097 B2 | 7/2005 | Chow et al. | |
| 6,927,096 B2 | 8/2005 | Shimanuki | |
| 6,933,598 B2 | 8/2005 | Karnezos | |
| 6,977,431 B1 * | 12/2005 | Oh et al. | 257/696 |
| 7,042,068 B2 * | 5/2006 | Ahn et al. | 257/666 |
| 7,045,887 B2 | 5/2006 | Karnezos | |
| 7,049,691 B2 | 5/2006 | Karnezos | |
| 7,053,477 B2 | 5/2006 | Karnezos et al. | |
| 7,057,269 B2 | 6/2006 | Karnezos | |
| 7,061,088 B2 | 6/2006 | Karnezos | |
| 7,101,731 B2 | 9/2006 | Karnezos | |
| 7,109,576 B2 * | 9/2006 | Bolken et al. | 257/686 |
| 7,163,842 B2 | 1/2007 | Karnezos | |
| 7,166,494 B2 | 1/2007 | Karnezos | |
| 7,169,642 B2 | 1/2007 | Karnezos | |
| 7,180,166 B2 | 2/2007 | Ho et al. | |
| 7,190,062 B1 * | 3/2007 | Sheridan et al. | 257/686 |
| 7,227,249 B1 * | 6/2007 | Chiang | 257/686 |
| 7,227,252 B2 * | 6/2007 | Bolken et al. | 257/686 |
| 7,235,871 B2 | 6/2007 | Corisis | |
| 7,245,007 B1 * | 7/2007 | Foster | 257/678 |
| 7,247,519 B2 | 7/2007 | Karnezos et al. | |
| 7,247,934 B2 | 7/2007 | Pu | |
| 7,253,511 B2 | 8/2007 | Karnezos et al. | |
| 7,288,434 B2 | 10/2007 | Karnezos | |
| 7,291,926 B2 | 11/2007 | Tao et al. | |
| 7,351,610 B2 | 4/2008 | Karnezos | |
| 7,358,115 B2 | 4/2008 | Karnezos | |
| 7,361,533 B1 * | 4/2008 | Huemoeller et al. | 438/123 |
| 7,364,946 B2 | 4/2008 | Karnezos | |
| 7,372,141 B2 | 5/2008 | Karnezos et al. | |
| 7,394,148 B2 | 7/2008 | Karnezos | |
| 7,429,786 B2 | 9/2008 | Karnezos et al. | |
| 7,429,787 B2 | 9/2008 | Karnezos et al. | |
| 7,598,606 B2 * | 10/2009 | Chow et al. | 257/686 |
| 7,622,332 B2 | 11/2009 | Islam et al. | |
| 7,629,677 B2 * | 12/2009 | Youn et al. | 257/676 |
| 8,053,883 B2 * | 11/2011 | Galera et al. | 257/686 |
| 2002/0031865 A1 * | 3/2002 | Chen et al. | 438/123 |
| 2002/0041019 A1 | 4/2002 | Gang | |
| 2002/0100963 A1 * | 8/2002 | Suzuki et al. | 257/678 |
| 2002/0105068 A1 * | 8/2002 | Fukumoto et al. | 257/686 |
| 2002/0109216 A1 | 8/2002 | Matsuzaki et al. | |
| 2002/0167074 A1 | 11/2002 | Kim | |
| 2003/0127729 A1 * | 7/2003 | Fukumoto et al. | 257/723 |
| 2004/0012992 A1 * | 1/2004 | Koh et al. | 365/63 |
| 2004/0056277 A1 * | 3/2004 | Karnezos | 257/200 |
| 2004/0061212 A1 * | 4/2004 | Karnezos | 257/686 |
| 2004/0061213 A1 * | 4/2004 | Karnezos | 257/686 |
| 2004/0063242 A1 * | 4/2004 | Karnezos | 438/106 |
| 2004/0063246 A1 * | 4/2004 | Karnezos | 438/108 |
| 2004/0065963 A1 * | 4/2004 | Karnezos | 257/777 |
| 2004/0114426 A1 | 6/2004 | Fee et al. | |
| 2004/0227250 A1 * | 11/2004 | Bolken et al. | 257/777 |
| 2005/0133897 A1 | 6/2005 | Baek et al. | |
| 2005/0161806 A1 * | 7/2005 | Divakar et al. | 257/717 |
| 2005/0253224 A1 * | 11/2005 | Ho et al. | 257/666 |
| 2006/0001136 A1 * | 1/2006 | Tao et al. | 257/676 |
| 2006/0046531 A1 | 3/2006 | Sinclair | |
| 2006/0055009 A1 * | 3/2006 | Shim et al. | 257/666 |
| 2006/0091516 A1 * | 5/2006 | Matsunami | 257/686 |
| 2007/0209834 A1 | 9/2007 | Kuan et al. | |
| 2007/0210424 A1 | 9/2007 | Ho et al. | |
| 2007/0210443 A1 | 9/2007 | Merilo et al. | |
| 2007/0247614 A1 | 10/2007 | Puah et al. | |

* cited by examiner

INTEGRATED CIRCUIT PACKAGE IN PACKAGE SYSTEM

CROSS-REFERENCE TO RELATED APPLICATION(S)

This is a divisional of co-pending U.S. patent application Ser. No. 11/276,647 filed Mar. 8, 2006.

The present application contains subject matter related to U.S. patent application Ser. No. 11/276,646 filed Mar. 8, 2006. The related application is assigned to STATS ChipPAC Ltd.

The present application contains subject matter also related to U.S. patent application Ser. No. 11/276,645 filed Mar. 8, 2006. The related application is assigned to STATS ChipPAC Ltd.

TECHNICAL FIELD

The present invention relates generally to integrated circuit package systems, and more particularly to an integrated circuit package system for a leadless package in package.

BACKGROUND ART

Consumers continue to demand higher performance and lower cost products. These demands increased miniaturization of components, and greater packaging density of integrated circuits ("IC's"). The increasing functionality and decreasing size and number of system components make IC's more and more susceptible to damage during manufacturing and in use. Integrated circuit packages are commonly used to encase the IC and its connectivity to electrical interconnections. The integrated circuit package both protects the circuit and provides electrical interconnections to external circuitry.

IC devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module base leadframe that is surrounded by a number of lead fingers. Each die has bonding pads that are then individually connected in a wire-bonding operation to the leadframe's lead finger pads using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or base leadframe) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a base leadframe.

To condense further the packaging of individual devices, packages have been developed in which more than one device can be packaged at one time at each package site. Each package site is a structure that provides mechanical support for the individual IC devices. It also provides one or more layers of interconnect lines that enable the devices to be connected electrically to surrounding circuitry. Of importance to complicated packaging designs are considerations of input/output count, heat dissipation, matching of thermal expansion between a motherboard and its attached components, cost of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC chip, that incorporates all the same functions. Current multi-chip modules typically consist of a PCB base leadframe onto which a set of separate IC chip components is directly attached. Such multi-chip modules have been found to increase circuit density and miniaturization, improve signal propagation speed, reduce overall device size and weight, improve performance, and lower costs—all primary goals of the computer industry.

However, such multi-chip modules can be bulky. IC package density is determined by the area required to mount a die or module on a circuit board. One method for reducing the board size of multi-chip modules and thereby increase their effective density is to stack the die or chips vertically within the module or package.

Such designs are improvements over prior multi-chip package and system-in-a-package ("SiP") designs that combined several semiconductor die and associated passive components ("passives") side by side in a single, horizontal layer. Combining them into a single horizontal layer used board space inefficiently by consuming large base leadframe areas, and afforded less advantage in circuit miniaturization.

However, multi-chip modules, whether vertically or horizontally arranged, can also present problems because they usually must be assembled before the component chips and chip connections can be tested. That is, because the electrical bond pads on a die are so small, it is difficult to test die before assembly onto a base leadframe. Thus, when die are mounted and connected individually, the die and connections can be tested individually, and only known-good-die ("KGD") free of defects are then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process problems including yield.

Despite the advantages of recent developments in semiconductor fabrication and packaging techniques, there is a continuing need for improved packaging methods, systems, and designs for increasing semiconductor die density in PCB assemblies.

Thus, a need still remains for an integrated circuit package in package system to provide improved reliability and manufacturing yield. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package in package system, including: a base integrated circuit package with a base lead substantially coplanar with a base die paddle and having a portion with a substantially planar base surface; an extended-lead integrated circuit package with an extended lead having a portion with a substantially planar lead-end surface; a package-stacking layer over the base integrated circuit package; and the extended-lead integrated circuit package over the base integrated circuit package including: an end portion of the extended lead, directly on the package-stacking layer, and the extended lead exposed by and extending away from the bottom of the side of an extended-lead encapsulation and bending downwards toward the direction of the package stacking layer with the substantially planar lead-end surface coplanar with the substantially planar base surface.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
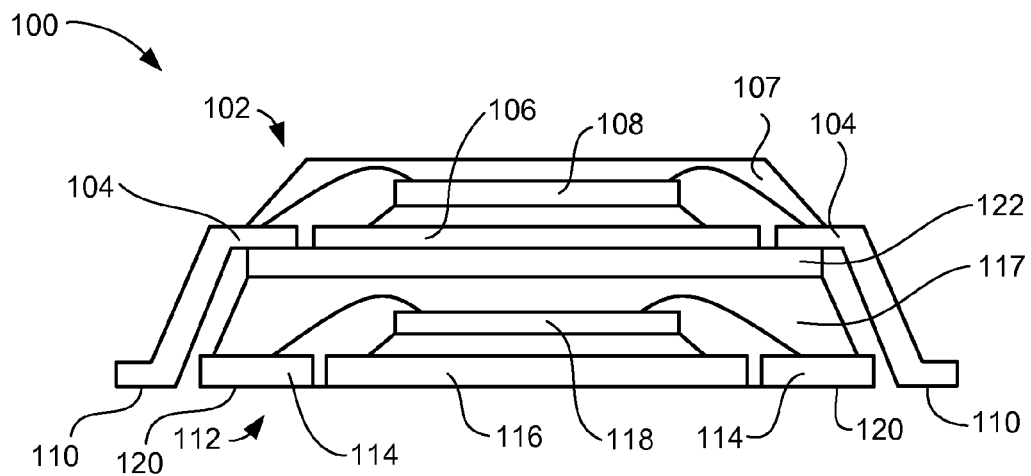
FIG. 1 is a cross-sectional view of an integrated circuit package in package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings for ease of description show the invention with surfaces as oriented downward, this arrangement in the FIGS. is arbitrary and is not intended to suggest that invention should necessarily be in a downward direction. Generally, the device can be operated in any orientation. In addition, the same numbers are used in all the drawing FIGS. to relate to the same elements.

The term "horizontal" as used herein is defined as a plane parallel to the conventional plane or surface of the invention, regardless of its orientation. The term "vertical" refers to a direction perpendicular to the horizontal as just defined. The term "on" refers to direct contact among elements. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package in package system 100 in an embodiment of the present invention. The integrated circuit package in package system 100 includes an extended-lead integrated circuit package 102. The extended-lead integrated circuit package 102 includes an extended leads 104 and an extended-lead die paddle 106. A top integrated circuit die 108 is attached and electrically connected to the extended-lead die paddle 106. A lead-end surface 110 is substantially planar and extends beyond a side opposite the top integrated circuit die 108. An extended-lead encapsulant 107 covers the top integrated circuit die 108, the extended-lead die paddle 106 and part of the extended leads 104. The top integrated circuit die 108 may provide functions, such as logic, processing or any combination thereof.

For illustrative purposes, the top integrated circuit die 108 is shown as a wire bondable integrated circuit die, although it is understood that the top integrated circuit die 108 may be different, such as a flip chip. Further, for illustrative purposes the extended-lead integrated circuit package 102 is shown with one integrated circuit die, although it is understood that any number of integrated circuit die may be included.

The integrated circuit package in package system 100 also includes a base integrated circuit package 112, such as a quad flat no lead or a land grid array, having base leads 114 and a base die paddle 116. A base encapsulant 117 covers a bottom integrated circuit die 118, the base die paddle 116 and part of the base leads 114. The base leads 114 are substantially coplanar with the base die paddle 116. The bottom integrated circuit die 118 is attached and electrically connected to the base die paddle 116. A base surface 120 is substantially planar on a side opposite the bottom integrated circuit die 118. The bottom integrated circuit die 118 may provide functions, such as flash memory, DRAM or any combination thereof, to the integrated circuit package in package system 100.

For illustrative purposes the bottom integrated circuit die 118 is shown as a wire bondable integrated circuit die, although it is understood that the bottom integrated circuit die 118 may be different, such as a flip chip. Further, for illustrative purposes the base integrated circuit package 112 is shown with one integrated circuit die, although it is understood that any number of integrated circuit die may be included.

The extended-lead integrated circuit package 102 is mounted over the base integrated circuit package 112. A package-stacking layer 122 holds the extended-lead integrated circuit package 102 and the base integrated circuit package 112 in a substantially fixed position. The extended-lead die paddle 106 and an end portion of extended leads 104 are positioned directly on the package-stacking layer 122. The package-stacking layer 122 may also provide thermal or electrical properties, such as conduction or insulation. The lead-end surface 110 and the base surface 120 are in substantially the same plane or coplanar. The extended leads 104 provide electrical interconnectivity for the top integrated circuit die 108 in substantially the same plane as the base leads 114 for the bottom integrated circuit die 118. The top integrated circuit die 108 and the bottom integrated circuit die 118 may be connected to a next level system such as a printed circuit board. The extended leads 104 are exposed by and extend away from the bottom of the side of the extended lead encapsulation 107 and bend downward toward the direction of the package stacking layer 122.

Figure 2:
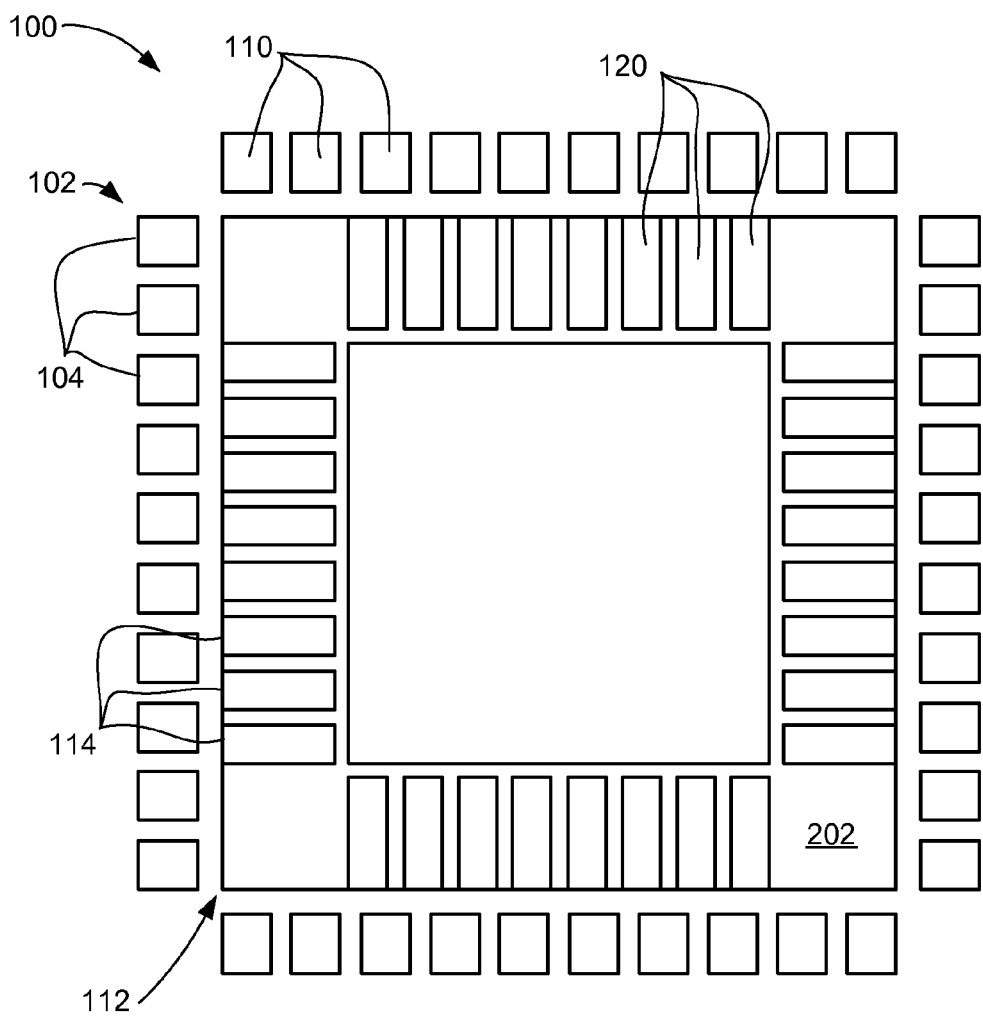
FIG. 2 is a bottom plan view of the integrated circuit package in package system.

Referring now to FIG. 2, therein is shown a bottom plan view of the integrated circuit package in package system 100. The extended-lead integrated circuit package 102 includes the extended leads 104 and the base integrated circuit package 112 includes the base leads 114. The extended leads 104 are held by the extended-lead integrated circuit package 102. The base leads 114 are held substantially fixed by a base encapsulant 202. The lead-end surface 110 of the extended leads 104 and the base surface 120 of the base leads 114 provide a connection surface on the lower extent of the integrated circuit package in package system 100. The extended leads 104 and the base leads 114 provide electrical interconnectivity to the next level system.

For illustrative purposes, the extended-lead integrated circuit package 102 is shown with 40 of the extended leads 104 and the base integrated circuit package 112 is shown with 32 of the base leads 114, although it is understood that any number of leads may be used.

Figure 3:
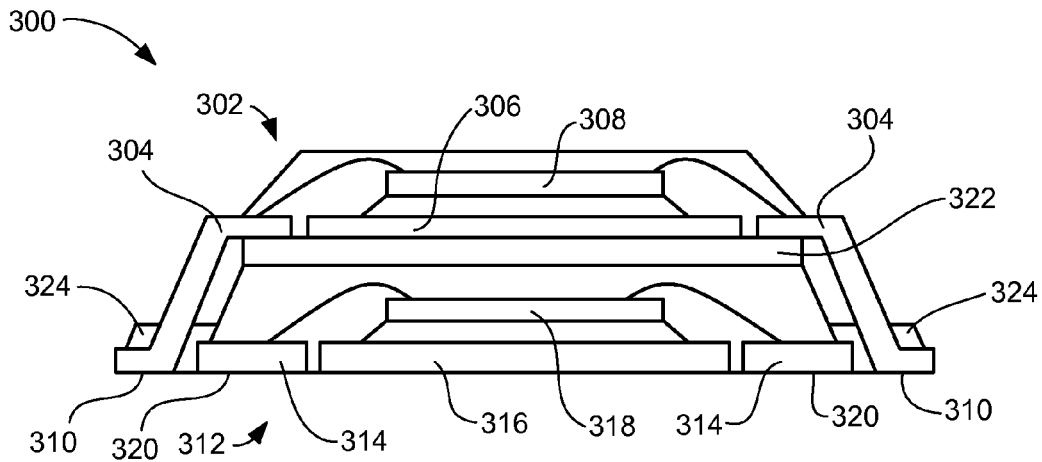
FIG. 3 is a cross-sectional view of a medium integrated circuit package in package system in an alternative embodiment of the present invention.

Referring now to FIG. 3, therein is shown a cross-sectional view of a medium integrated circuit package in package system 300 in an alternative embodiment of the present invention. The medium integrated circuit package in package system 300 may be approximately 10 mm×10 mm to approximately 18 mm×18 mm. Similar to the integrated circuit package in package system 100 of FIG. 1, the medium integrated circuit package in package system 300 includes an extended-lead integrated circuit package 302.

The extended-lead integrated circuit package 302 includes extended leads 304 and an extended-lead die paddle 306. A top integrated circuit die 308 is attached and electrically connected to the extended-lead die paddle 306. A lead-end surface 310 is substantially planar and extends beyond a side opposite the top integrated circuit die 308. The top integrated circuit die 308 may provide functions, such as logic, processing or any combination thereof For illustrative purposes, the top integrated circuit die 308 is shown as a wire bondable integrated circuit die, although it is understood that the top integrated circuit die 308 may be different, such as a flip chip. Further, for illustrative purposes the extended-lead integrated circuit package 302 is shown with one integrated circuit die, although it is understood that any number of integrated circuit die may be included.

The medium integrated circuit package in package system 300 also includes a base integrated circuit package 312, such as a quad flat no lead or a land grid array, having base leads 314 and a base die paddle 316. A bottom integrated circuit die 318 is attached and electrically connected to the base die paddle 316. A base surface 320 is substantially planar on a side opposite the bottom integrated circuit die 318. The bottom integrated circuit die 318 may provide functions, such as flash memory, DRAM or any combination thereof, to the medium integrated circuit package in package system 300.

For illustrative purposes the bottom integrated circuit die 318 is shown as a wire bondable integrated circuit die, although it is understood that the bottom integrated circuit die 318 may be different, such as a flip chip. Further, for illustrative purposes the base integrated circuit package 312 is shown with one integrated circuit die, although it is understood that any number of integrated circuit die may be included.

The extended-lead integrated circuit package 302 is mounted over the base integrated circuit package 312. A package-stacking layer 322 holds the extended-lead integrated circuit package 302 and the base integrated circuit package 312 in a substantially fixed position. The lead-end surface 310 and the base surface 320 are in substantially the same plane or coplanar.

A lead-end encapsulant 324, such as glob top or resin, may be applied to provide good planarity when warpage is possible, such as in medium size packages. The lead-end encapsulant 324 is flush or co-planar with the lead-end surface 310 and the base surface 320. The extended leads 304 provide electrical interconnectivity for the top integrated circuit die 308 in substantially the same plane as the base leads 314 for the bottom integrated circuit die 318.

Figure 4:
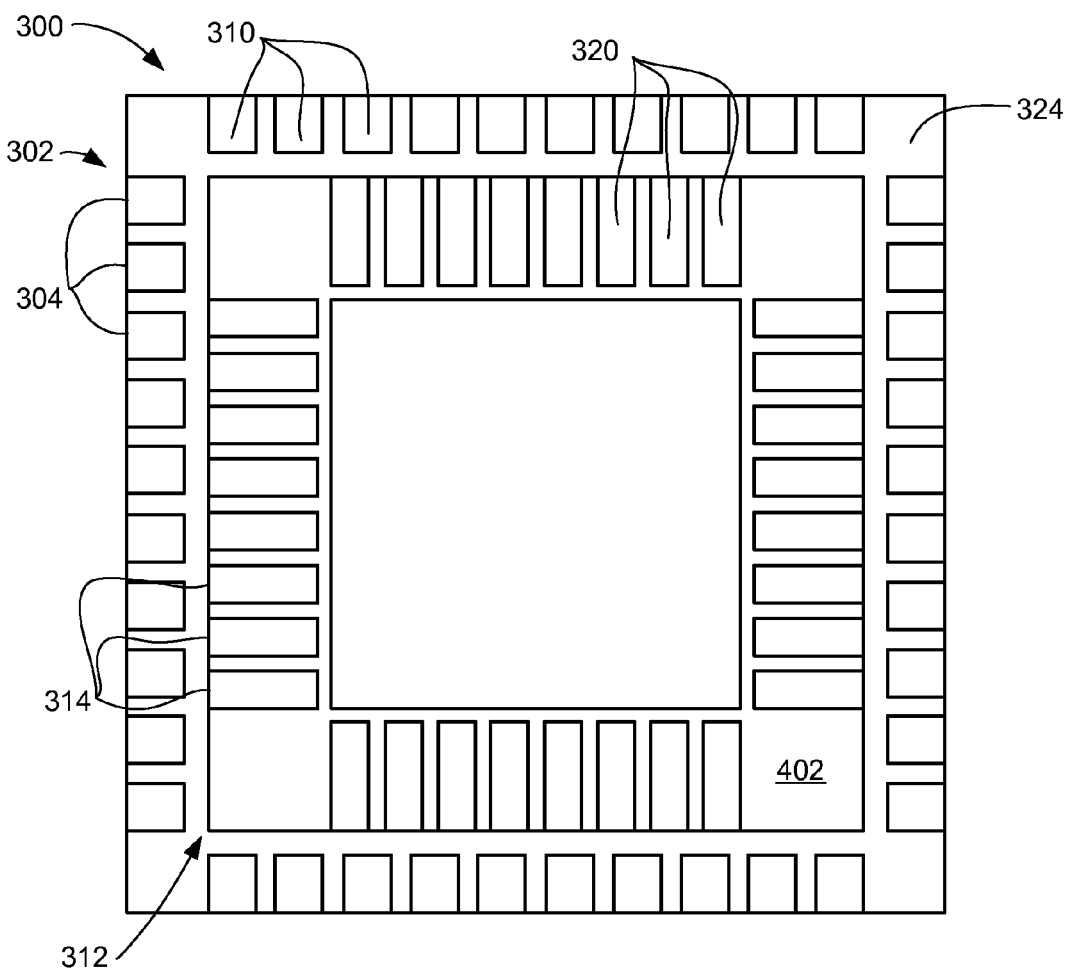
FIG. 4 is a bottom plan view of the medium integrated circuit package in package system.

Referring now to FIG. 4, therein is shown a bottom plan view of the medium integrated circuit package in package system 300. The extended-lead integrated circuit package 302 includes the extended leads 304 and the base integrated circuit package 312 includes the base leads 314. The extended leads 304 are held by the extended-lead integrated circuit package 302 and the lead-end encapsulant 324. The base leads 314 are held substantially fixed by a base encapsulant 402. The lead-end surface 310 of the extended leads 304 and the base surface 320 of the base leads 314 provide a connection surface on the lower extent of the medium integrated circuit package in package system 300. The extended leads 304 and the base leads 314 provide electrical interconnectivity to the next level system.

For illustrative purposes, the extended-lead integrated circuit package 302 is shown with 40 of the extended leads 304 and the base integrated circuit package 312 is shown with 32 of the base leads 314, although it is understood that any number of leads may be used.

Figure 5:
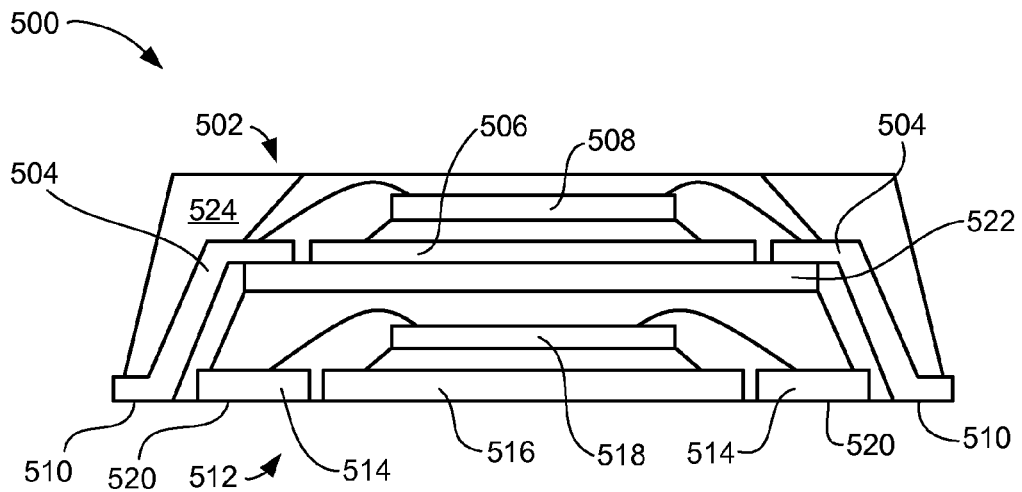
FIG. 5 is a cross-sectional view of a large integrated circuit package in package system in an alternative embodiment of the present invention.

Referring now to FIG. 5, therein is shown a cross-sectional view of a large integrated circuit package in package system 500 in an alternative embodiment of the present invention. The large integrated circuit package in package system 500 may be greater than approximately 18 mm×18 mm. Similar to the integrated circuit package in package system 100 of FIG. 1, the large integrated circuit package in package system 500 includes an extended-lead integrated circuit package 502.

The extended-lead integrated circuit package 502 includes extended leads 504 and an extended-lead die paddle 506. A top integrated circuit die 508 is attached and electrically connected to the extended-lead die paddle 506. A lead-end surface 510 is substantially planar and extends beyond a side opposite the top integrated circuit die 508. The top integrated circuit die 508 may provide functions, such as logic, processing or any combination thereof For illustrative purposes, the top integrated circuit die 508 is shown as a wire bondable integrated circuit die, although it is understood that the top integrated circuit die 508 may be different, such as a flip chip. Further, for illustrative purposes the extended-lead integrated circuit package 502 is shown with one integrated circuit die, although it is understood that any number of integrated circuit die may be included.

The large integrated circuit package in package system 500 also includes a base integrated circuit package 512, such as a quad flat no lead or a land grid array, having base leads 514 and a base die paddle 516. A bottom integrated circuit die 518 is attached and electrically connected to the base die paddle 516. A base surface 520 is substantially planar on a side opposite the bottom integrated circuit die 518. The bottom integrated circuit die 518 may provide functions, such as flash memory, DRAM or any combination thereof, to the large integrated circuit package in package system 500.

For illustrative purposes the bottom integrated circuit die 518 is shown as a wire bondable integrated circuit die, although it is understood that the bottom integrated circuit die 518 may be different, such as a flip chip. Further, for illustrative purposes the base integrated circuit package 512 is shown with one integrated circuit die, although it is understood that any number of integrated circuit die may be included.

The extended-lead integrated circuit package 502 is mounted over the base integrated circuit package 512. A package-stacking layer 522 holds the extended-lead integrated circuit package 502 and the base integrated circuit package 512 in a substantially fixed position. The lead-end surface 510 and the base surface 520 are in substantially the same plane or coplanar. A package encapsulant 524, such as a molding compound, may be applied to limit warpage for large size packages. The package encapsulant 524 is flush or co-planar with the lead-end surface 510 and the base surface 520. The extended leads 504 provide electrical interconnectivity for the top integrated circuit die 508 in substantially the same plane as the base leads 514 for the bottom integrated circuit die 518.

Figure 6:
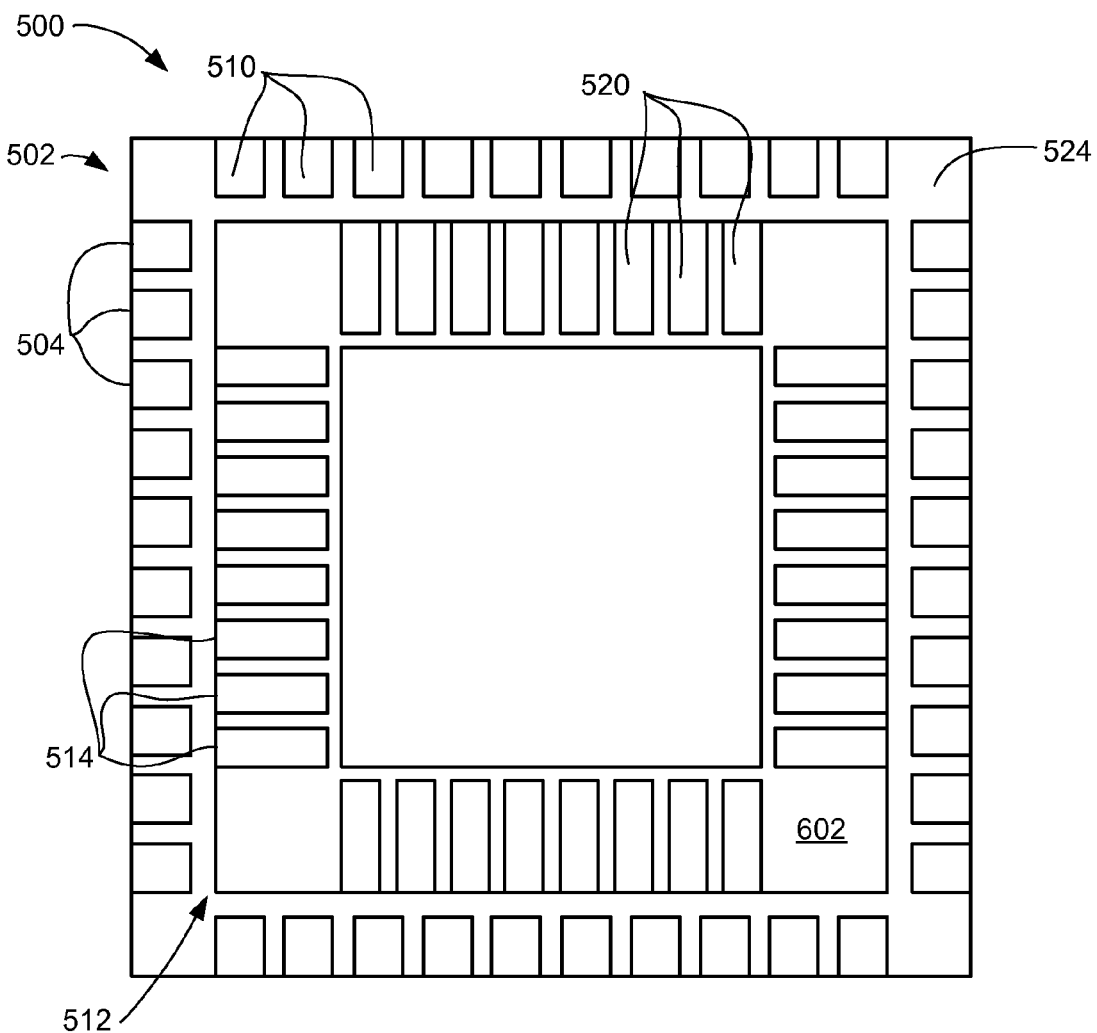
FIG. 6 is a bottom plan view of the large integrated circuit package in package system.

Referring now to FIG. 6, therein is shown a bottom plan view of the large integrated circuit package in package system 500. The extended-lead integrated circuit package 502 includes the extended leads 504 and the base integrated circuit package 512 includes the base leads 514. The extended leads 504 are held by the extended-lead integrated circuit package 502 and the package encapsulant 524. The base leads 514 are held substantially fixed by a base encapsulant 602. The lead-end surface 510 of the extended leads 504 and the base surface 520 of the base leads 514 provide a connection surface on the lower extent of the large integrated circuit package in package system 500. The extended leads 504 and the base leads 514 provide electrical interconnectivity to the next level system.

For illustrative purposes, the extended-lead integrated circuit package 502 is shown with 40 of the extended leads 504 and the base integrated circuit package 512 is shown with 32 of the base leads 514, although it is understood that any number of leads may be used.

Figure 7:
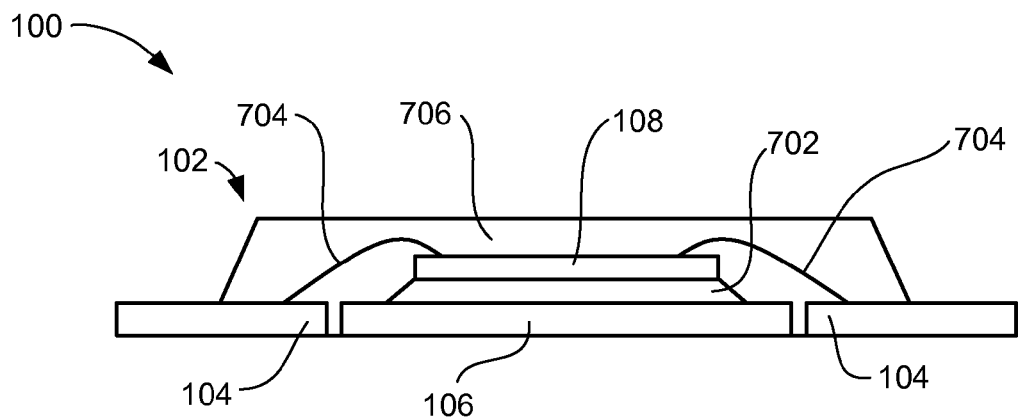
FIG. 7 is a cross-sectional view of the integrated circuit package in package system in an extended-lead-package forming phase.

Referring now to FIG. 7, therein is shown a cross-sectional view of the integrated circuit package in package system 100 in an extended-lead-package forming phase. The extended-lead integrated circuit package 102 includes the extended leads 104 and the extended-lead die paddle 106. The extended leads 104 and the extended-lead die paddle 106 are formed substantially planar without the need for a downset. A top die attach material 702 attaches the top integrated circuit die 108 on the extended-lead die paddle 106. Extended-lead connections 704, such as wire bonds or solder bumps, electrically connect the top integrated circuit die 108 to the extended leads 104.

An extended-lead encapsulant 706 covers the top integrated circuit die 108, the extended-lead connections 704, the extended-lead die paddle 106 and part of the extended leads 104. An encapsulation process, such as film-assist molding, applies the extended-lead encapsulant 706 flush or coplanar with the lead-end surface 110 and a bottom surface of the extended-lead die paddle 106. The extended leads 104 extend beyond the extents of the extended-lead encapsulant 706.

The extended-lead integrated circuit package 102 may be tested as a discrete package. The testing includes the top integrated circuit die 108 through the extended-lead connections 704 and the extended leads 104. Functional tests as well as performance tests may be performed on the extended-lead integrated circuit package 102. Validating the integrity and performance of components in the packaging provides a known good package with known good die. The known good package improves yield, reliability and quality of not only the integrated circuit package in package system 100 but also that of a next level system, such as a printed circuit board or another package.

Figure 8:
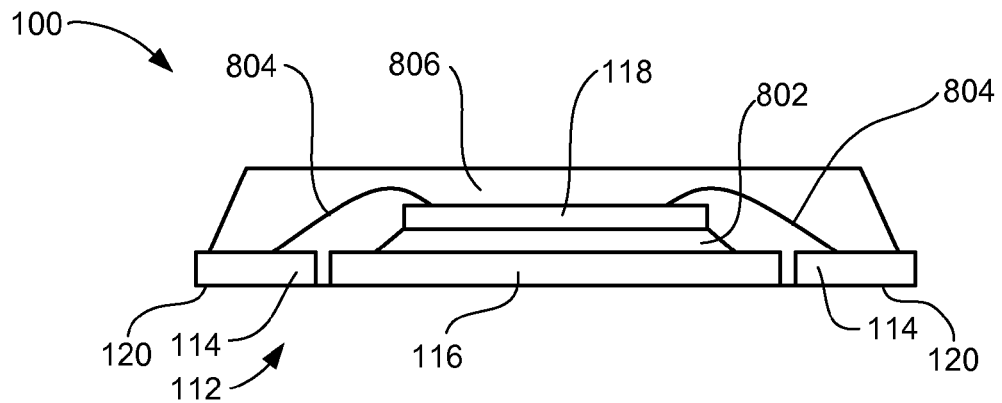
FIG. 8 is a cross-sectional view of the integrated circuit package in package system in a base-package forming phase.

Referring now to FIG. 8, therein is shown a cross-sectional view of the integrated circuit package in package system 100 in a base-package forming phase. The base integrated circuit package 112 includes the base leads 114 and the base die paddle 116, which is optional. A bottom die attach material 802 attaches the bottom integrated circuit die 118 on the base die paddle 116. Base connections 804, such as wire bonds or solder bumps, electrically connect the bottom integrated circuit die 118 to the base leads 114.

A base encapsulant 806 covers the bottom integrated circuit die 118, the base connections 804, the base die paddle 116 and part of the base leads 114. An encapsulation process, such as film-assist molding, applies the base encapsulant 806 flush or coplanar with the base surface 120 and the bottom surface of the base die paddle 116. The encapsulation process provides the base surface 120 substantially exposed.

The base integrated circuit package 112 may be tested as a discrete package. The testing includes the bottom integrated circuit die 118 through the base connections 804 and the base leads 114. Functional tests as well as performance tests may be performed on the base integrated circuit package 112. Validating the integrity and performance of components in the packaging provides a known good package with known good die. The known good package improves yield, reliability and quality of not only the integrated circuit package in package system 100 but also that of the next level system.

Figure 9:
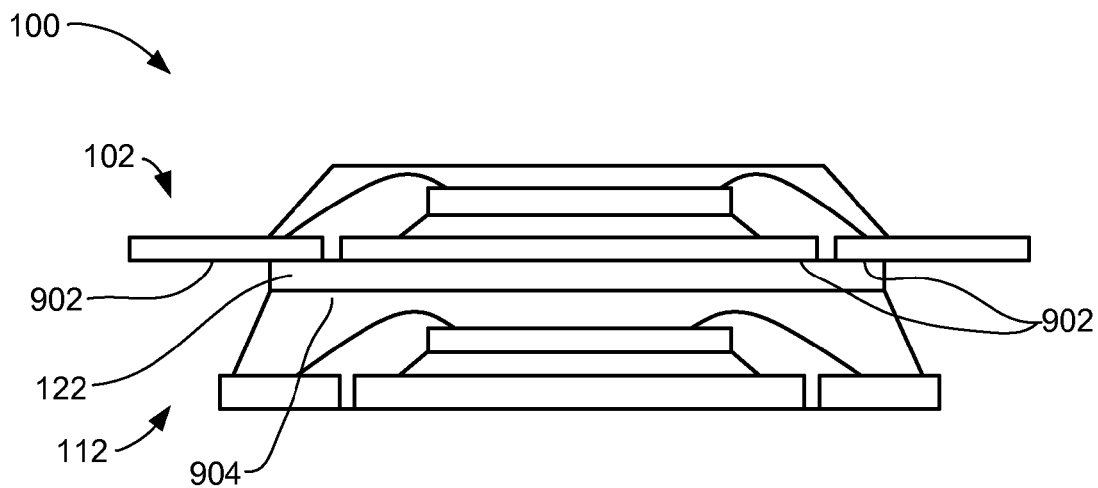
FIG. 9 is a cross-sectional view of the integrated circuit package in package system in an extended-lead-package mounting phase.

Referring now to FIG. 9, therein is shown a cross-sectional view of the integrated circuit package in package system 100 in an extended-lead-package mounting phase. The extended-lead integrated circuit package 102 includes a bottom surface 902. The base integrated circuit package 112 includes a mold cap 904 formed by the base encapsulant 202. The package-stacking layer 122, such as an adhesive or an adhesive film, attaches the bottom surface 902 over the mold cap 904. The extended-lead integrated circuit package 102 and the base integrated circuit package 112 are held substantially fixed for further processing and attachment to the next level system. The package-stacking layer 122 may also provide thermal or electrical properties, such as heat dissipation or electrical insulation.

Figure 10:
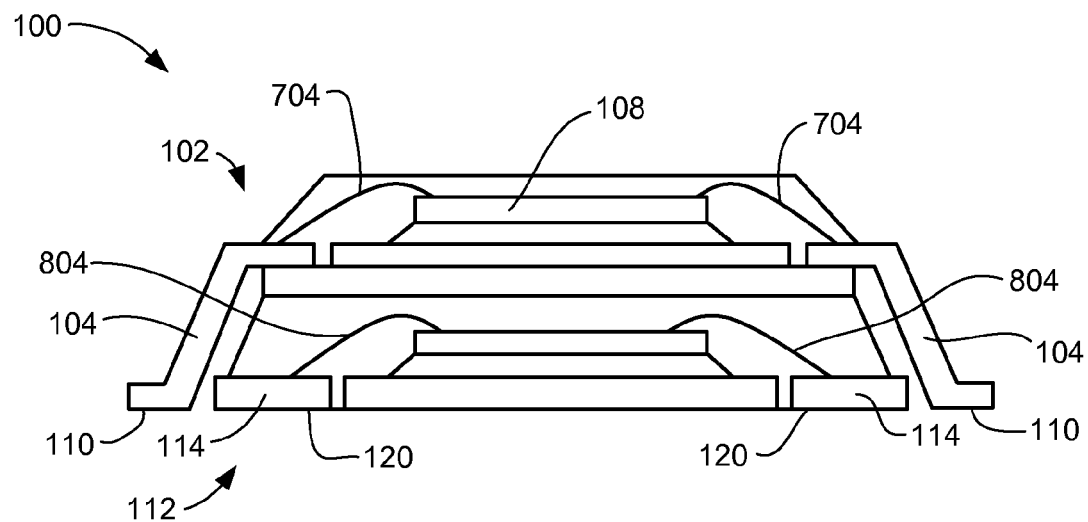
FIG. 10 is a cross-sectional view of the integrated circuit package in package system in an extended-lead-package trim-and-form phase.

Referring now to FIG. 10, therein is shown a cross-sectional view of the integrated circuit package in package system 100 in an extended-lead-package trim-and-form phase. The extended-lead integrated circuit package 102 includes the extended leads 104 having the lead-end surface 110. The extended leads 104 are further formed by a trim and form process by which the extended leads 104 may be cut and bent to a predetermined shape and a predetermined height.

The extended leads 104 are bent in a downward direction towards a side opposite the top integrated circuit die 108 and along the sides of the base integrated circuit package 112. The extended leads 104 provide the lead-end surface 110 substantially coplanar with the base surface 120 of the base integrated circuit package 112. The extended leads 104 may be substantially fixed in a small size package, less than approximately 10 mm×10 mm, having substantially no package warpage.

The top integrated circuit die 108 connects through the extended-lead connections 704 and the extended leads 104. Similarly, the bottom integrated circuit die 118 connects through the base connections 804 and the base leads 114. The lead-end surface 110 of the extended leads 104 and the base surface 120 of the base leads 114 provide a substantially planar electrical interconnectivity surface for the next level system, such as a printed circuit board.

Figure 11:
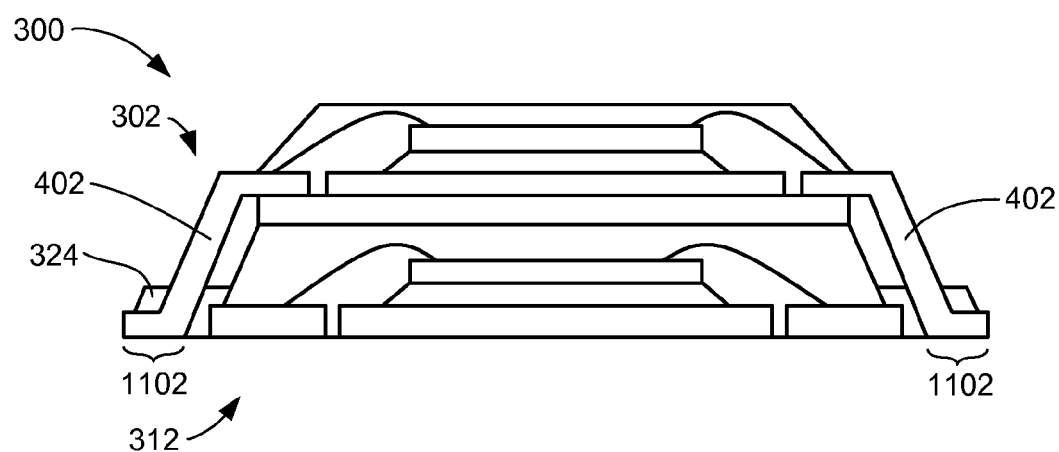
FIG. 11 is a cross-sectional view of the medium integrated circuit package in package system in a lead encapsulating phase.

Referring now to FIG. 11, therein is shown a cross-sectional view of the medium integrated circuit package in package system 300 in a lead encapsulating phase. The medium integrated circuit package in package system 300 may be a medium size package, approximately 10 mm×10 mm to 18 mm×18 mm. Some package warpage is possible with the medium size package. The lead-end encapsulant 324, such as glob top or resin, may be applied to provide good planarity when warpage is possible. An encapsulating process may be used to apply the lead-end encapsulant 324.

The lead-end encapsulant 324 covers the bottom of the base integrated circuit package 312 and the bottom of the extended-lead integrated circuit package 302 including lead ends 1102 of the extended leads 304. The lead-end encapsulant 324 provides a substantially fixed position for the extended leads 304. The substantially fixed position of the extended leads 304 provides isolation between each of the extended leads 304 as well as coplanarity between the extended leads and the base leads 314.

Figure 12:
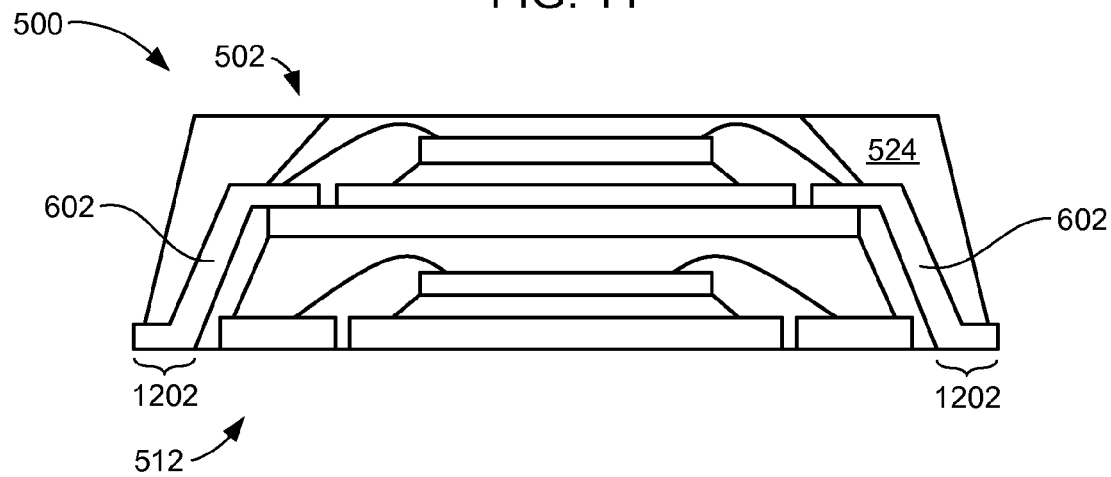
FIG. 12 is a cross-sectional view of the large integrated circuit package in package system in a package system molding phase.

Referring now to FIG. 12, therein is shown a cross-sectional view of the large integrated circuit package in package system 500 in a package system-molding phase. The large integrated circuit package in package system 500 may be a large size package, greater than approximately 18 mm×18 mm. Some package warpage is possible with the large size package. The package encapsulant 524, such as molding compound, may be applied to provide good planarity when warpage is possible. An encapsulating process may be used to apply the package encapsulant 524.

The package encapsulant 524 covers a portion of the base integrated circuit package 512 and a portion of the extended-lead integrated circuit package 502 including lead ends 1202 of the extended leads 504. The package encapsulant 524 provides a substantially fixed position for the extended leads 504. The substantially fixed position of the extended leads 504 provides isolation between each of the extended leads 504 as well as coplanarity between the extended leads and the base leads 514.

Figure 13:
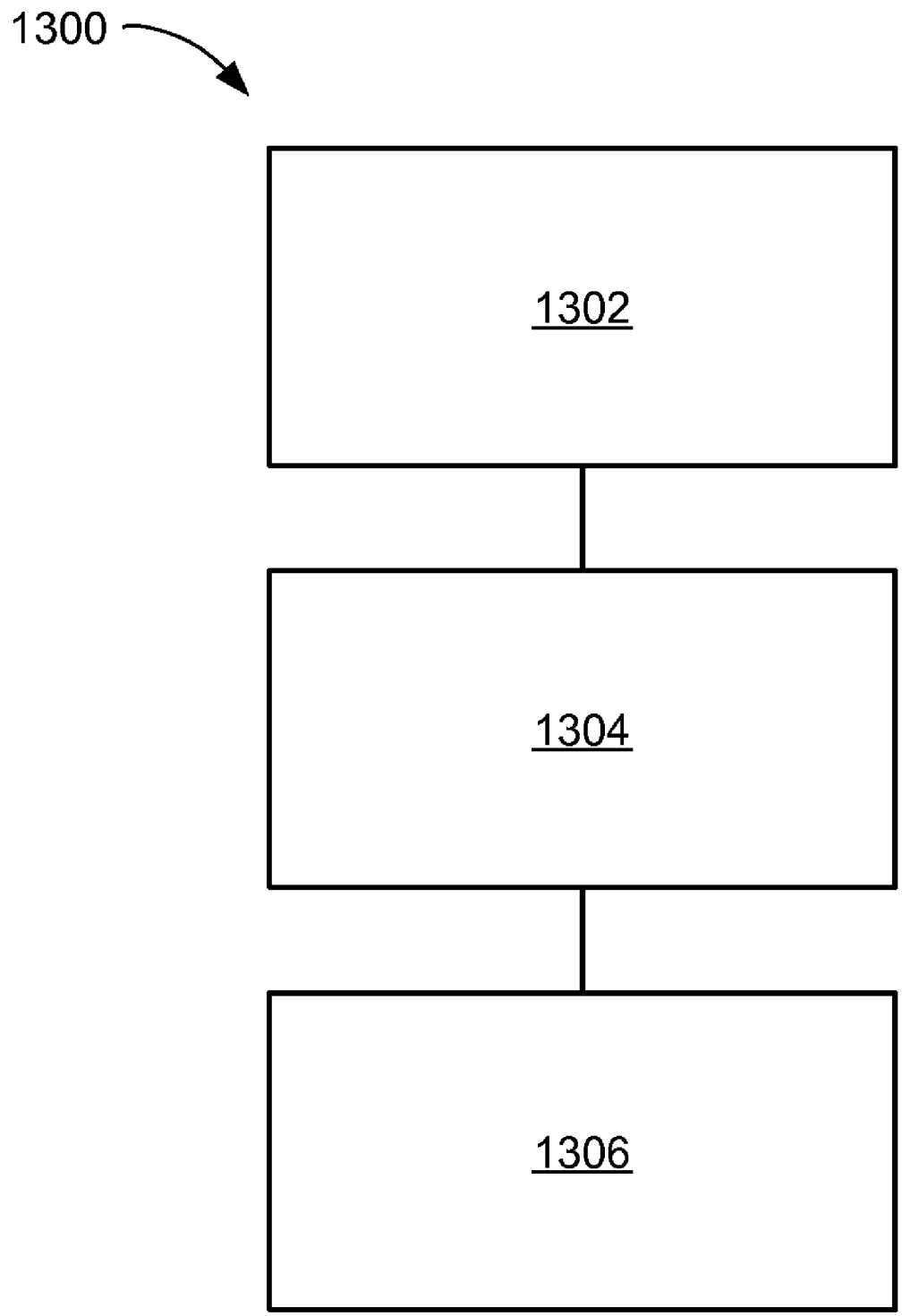
FIG. 13 is a flow chart of an integrated circuit package in package system for manufacturing the integrated circuit package in package system in an embodiment of the present invention.

Referring now to FIG. 13 is a flow chart of an integrated circuit package in package system 1300 for manufacturing the integrated circuit package in package system 100 in an embodiment of the present invention. The system 1300 includes forming a base integrated circuit package with a base lead having a portion with a substantially planar base surface in a block 1302; forming an extended-lead integrated circuit package with an extended lead having a portion with a substantially planar lead-end surface in a block 1304; and stacking the extended-lead integrated circuit package over the base integrated circuit package with the substantially planar lead-end surface coplanar with the substantially planar base surface in a block 1306.

In greater detail, a method to fabricate the integrated circuit package in package system 100, in an embodiment of the present invention, is performed as follows:

1. Forming a base integrated circuit package with a base surface of base leads substantially planar to one another and exposed. (FIG. 8)
2. Forming an extended-lead integrated circuit package with a lead-end surface of extended leads substantially planar to one another and exposed. (FIG. 7)
3. Stacking the extended-lead integrated circuit package over the base integrated circuit package with the lead-end surface coplanar with the base surface and having the lead-end surface and the base surface exposed for electrical connection. (FIG. 10)

It has been discovered that the present invention thus has numerous aspects.

An aspect is that the present invention provides discrete integrated circuit packages in a 3D stack. Due to discrete integrated circuit packages, each of the integrated circuit packages may be tested individually. The integrated circuit packages may also contain one or more integrated circuits combined in one or some of several different interconnect or mounting processes.

It has been discovered that the disclosed structure provides improved yield. Testing each integrated circuit package individually ensures a known good package with a known good die. Integrated circuit die and their packages can be sorted before additional processing. The improvements in yield, reliability and quality extend to the present invention as well as any system in which it is included.

It has also been discovered that the disclosed structure provides a smaller size. The footprint as well as area is more compact and space efficient. Multiple integrated circuit die are efficiently placed over one another. It is particularly efficient in the critical dimensions for surface area with significant improvements over previous approaches.

Yet another discovery of the disclosed structure is improved manufacturing. The process can be implemented by adapting known, high volume and cost effective technologies. It also eliminates the need for special processes or features such as downset packaging, which may increase costs.

Yet another discovery of the disclosed structure is that many different devices may be included within the integrated circuit package system. Different functions particularly related functions could be combined. In the case of a system in package, logic, processors, flash, and DRAM could be interconnected or combined and encapsulated in a single package.

These and other valuable aspects of the present invention consequently further the state of the technology to at least the next level.

Thus, it has been discovered that the integrated circuit package in package system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. An integrated circuit package in package system comprising:
   a base integrated circuit package with a base lead substantially coplanar with a base die paddle and having a portion with a substantially planar base surface;
   an extended-lead integrated circuit package with an extended lead having a portion with a substantially planar lead-end surface;
   a package-stacking layer over the base integrated circuit package; and
   the extended-lead integrated circuit package over the base integrated circuit package including:
      an end portion of the extended lead, directly on the package-stacking layer, and
      the extended lead exposed by and extending away from the bottom of the side of an extended-lead encapsulation and bending downwards toward the direction of the package stacking layer with the substantially planar lead-end surface coplanar with the substantially planar base surface.

2. The system as claimed in claim 1 wherein the extended-lead integrated circuit package comprises the extended lead beyond an extended-lead encapsulant.

3. The system as claimed in claim 1 wherein the extended-lead integrated circuit package comprises the extended lead downward towards a side opposite a top integrated circuit die.

4. The system as claimed in claim 1 wherein the extended-lead integrated circuit package comprises a lead-end encapsulant over lead ends of the extended leads.

5. The system as claimed in claim 1 wherein the extended-lead integrated circuit package comprises a package encapsulant over a portion of the bottom integrated circuit die and a portion of the extended-lead integrated circuit package including lead ends of the extended leads.

6. The system as claimed in claim 1 wherein:
   the base integrated circuit package is a base integrated circuit package with a base surface of base leads substantially planar to one another and exposed;
   the extended-lead integrated circuit package is an extended-lead integrated circuit package with a lead-end surface of extended leads substantially planar to one another and exposed; and
   the extended-lead integrated circuit package is an extended-lead integrated circuit package over the base integrated circuit package with the lead-end surface coplanar with the base surface and having the lead-end surface and the base surface exposed for electrical connection.

7. The system as claimed in claim 6 wherein the extended-lead integrated circuit package comprises a bottom surface of the extended-lead integrated circuit package on the package-stacking layer.

8. The system as claimed in claim 6 wherein the package-stacking layer is attached on the base integrated circuit package.

9. The system as claimed in claim 6 wherein the extended-lead integrated circuit package comprises the extended-lead integrated circuit package discretely validated with functional tests and performance tests.

10. The system as claimed in claim 6 wherein the base integrated circuit package comprises the base integrated circuit package discretely validated with functional tests and performance tests.

* * * * *

UNITED STATES PATENT AND TRADEMARK OFFICE
CERTIFICATE OF CORRECTION

PATENT NO.        : 8,164,172 B2
APPLICATION NO.   : 13/166417
DATED             : April 24, 2012
INVENTOR(S)       : Ho et al.

It is certified that error appears in the above-identified patent and that said Letters Patent is hereby corrected as shown below:

<u>Title Page, INID (75) Inventors:</u>
delete "Antonio B. Dimaanor, Jr., Singapore (SG);" and insert therefor --Antonio B. Dimaano, Jr., Singapore (SG);--

Signed and Sealed this
Eighteenth Day of September, 2012

David J. Kappos
*Director of the United States Patent and Trademark Office*